United States Patent
Schumaker

(10) Patent No.: US 8,119,052 B2
(45) Date of Patent: Feb. 21, 2012

(54) DROP PATTERN GENERATION FOR IMPRINT LITHOGRAPHY

(75) Inventor: Philip D. Schumaker, Austin, TX (US)

(73) Assignee: Molecular Imprints, Inc., Austin, TX (US)

(*) Notice: Subject to any disclaimer, the term of this patent is extended or adjusted under 35 U.S.C. 154(b) by 0 days.

(21) Appl. No.: 12/262,669

(22) Filed: Oct. 31, 2008

(65) Prior Publication Data

US 2009/0115110 A1    May 7, 2009

Related U.S. Application Data

(63) Continuation-in-part of application No. 12/170,229, filed on Jul. 9, 2008, now abandoned.

(51) Int. Cl.
 *B29C 59/00*   (2006.01)
(52) U.S. Cl. .......... 264/293; 264/319; 425/385
(58) Field of Classification Search .......... 425/385, 425/877; 264/293, 319
See application file for complete search history.

(56) References Cited

U.S. PATENT DOCUMENTS

| | | | |
|---|---|---|---|
| 6,842,229 B2 | 1/2005 | Sreenivasan et al. | |
| 6,865,325 B2 | 3/2005 | Ide et al. | |
| 6,871,558 B2 | 3/2005 | Choi et al. | |
| 6,916,585 B2 | 7/2005 | Sreenivasan et al. | |
| 6,926,929 B2 | 8/2005 | Watts et al. | |
| 6,932,934 B2 | 8/2005 | Choi et al. | |
| 6,980,282 B2 | 12/2005 | Choi et al. | |
| 6,986,975 B2 | 1/2006 | Sreenivasan et al. | |
| 6,990,870 B2 | 1/2006 | Choi et al. | |
| 7,019,819 B2 | 3/2006 | Choi et al. | |
| 7,036,389 B2 | 5/2006 | Choi et al. | |
| 7,060,402 B2 | 6/2006 | Choi et al. | |
| 7,071,088 B2 | 7/2006 | Watts et al. | |
| 7,090,716 B2 | 8/2006 | McMackin et al. | |
| 7,110,085 B2 * | 9/2006 | Zaal et al. | 355/53 |
| 7,244,386 B2 | 7/2007 | Sreenivasan et al. | |
| 7,252,715 B2 | 8/2007 | Watts et al. | |
| 7,270,533 B2 | 9/2007 | McMackin et al. | |
| 7,281,919 B2 | 10/2007 | Shackleton et al. | |
| 7,298,456 B2 | 11/2007 | Cherala et al. | |
| 7,316,554 B2 | 1/2008 | Choi et al. | |
| 7,338,275 B2 | 3/2008 | Choi et al. | |
| 7,360,851 B1 | 4/2008 | Snyder | |
| 7,462,028 B2 | 12/2008 | Cherala et al. | |

(Continued)

OTHER PUBLICATIONS

Du et al., Centroidal Voronoi Tessellations: Applications and Algorithm, Society for Industrial and Applied Mathematices SIAM Review, pp. 637-676 Jan. 1, 1999.

(Continued)

*Primary Examiner* — Joseph Del Sole
*Assistant Examiner* — James Sanders
(74) *Attorney, Agent, or Firm* — Cameron A. King; Heather L. Flanagan; Fish & Richardson P.C.

(57) ABSTRACT

Generating a fluid drop pattern for an imprint lithography process includes selecting an imprinting surface with features and generating a fluid drop pattern including drop locations for placement of a multiplicity of drops of substantially equal volume on an imprint lithography substrate such that some of the drops are substantially aligned with at least some of the features. The fluid drop pattern is generated through an optimization process. The fluid drop pattern allows substantially complete filling of imprinting surface features and formation of a substantially uniform residual layer during the imprint lithography process.

14 Claims, 10 Drawing Sheets

U.S. PATENT DOCUMENTS

| | | | |
|---|---|---|---|
| 7,473,090 B2 | 1/2009 | McMackin et al. | |
| 7,517,211 B2 | 4/2009 | Kruijt-Stegeman | |
| 7,565,219 B2* | 7/2009 | Van Der Schaar et al. | ... 700/121 |
| 2003/0210210 A1* | 11/2003 | Ide et al. | ... 345/30 |
| 2004/0163563 A1 | 8/2004 | Sreenivasan et al. | |
| 2005/0061773 A1 | 3/2005 | Choi et al. | |
| 2005/0072757 A1 | 4/2005 | McMackin et al. | |
| 2005/0106321 A1 | 5/2005 | McMackin et al. | |
| 2005/0189676 A1 | 9/2005 | Sreenivasan | |
| 2005/0236739 A1 | 10/2005 | Willson et al. | |
| 2005/0270312 A1* | 12/2005 | Lad et al. | ... 347/1 |
| 2005/0276919 A1 | 12/2005 | Truskett et al. | |
| 2006/0063112 A1 | 3/2006 | Sreenivasan | |
| 2006/0076717 A1 | 4/2006 | Sreenivasan et al. | |
| 2006/0077374 A1 | 4/2006 | Sreenivasan et al. | |
| 2006/0115999 A1 | 6/2006 | Sreenivasan et al. | |
| 2006/0121728 A1 | 6/2006 | McMackin et al. | |
| 2006/0177532 A1 | 8/2006 | Fletcher et al. | |
| 2006/0177535 A1 | 8/2006 | McMackin et al. | |
| 2007/0063384 A1 | 3/2007 | Choi et al. | |
| 2007/0114686 A1 | 5/2007 | Choi et al. | |
| 2007/0126150 A1 | 6/2007 | GanapathiSubramanian et al. | |
| 2007/0132152 A1 | 6/2007 | Choi et al. | |
| 2007/0141271 A1* | 6/2007 | Xu et al. | ... 427/508 |
| 2007/0170617 A1 | 7/2007 | Choi et al. | |
| 2007/0228593 A1* | 10/2007 | Jones et al. | ... 264/40.4 |
| 2007/0228608 A1 | 10/2007 | Shackleton et al. | |
| 2007/0228610 A1 | 10/2007 | Sreenivasan et al. | |
| 2007/0243279 A1 | 10/2007 | McMackin et al. | |
| 2007/0246850 A1 | 10/2007 | Schumaker | |
| 2007/0275114 A1 | 11/2007 | Cherala et al. | |
| 2007/0278712 A1 | 12/2007 | Okushima | |
| 2008/0028360 A1 | 1/2008 | Picciotto et al. | |
| 2008/0141862 A1 | 6/2008 | Xu et al. | |
| 2008/0153312 A1 | 6/2008 | Sreenivasan et al. | |
| 2008/0174046 A1 | 7/2008 | Choi et al. | |
| 2008/0199816 A1 | 8/2008 | Choi et al. | |
| 2008/0303187 A1 | 12/2008 | Stacey et al. | |

OTHER PUBLICATIONS

PCT/US08/08467 International Search Report. Jan. 6, 2009.

Secord, Weighted Voronoi Stippling, NPAR 2002, Symposium on Non-Photorealistic Animation and Rendering, Annecy, France; Jun. 3, 2002, pp. 37-43 Jun. 3, 2002.

* cited by examiner

DROP PATTERN GENERATION FOR IMPRINT LITHOGRAPHY

CROSS-REFERENCE TO RELATED APPLICATIONS

This application claims the benefit under 35 U.S.C. §119 (e)(1) of U.S. Provisional Application Ser. No. 60/948,786, filed Jul. 10, 2007, which is hereby incorporated by reference. This application is also a continuation-in-part of U.S. patent application Ser. No. 12/170,229, filed Jul. 9, 2008, which is hereby incorporated by reference herein.

TECHNICAL FIELD

The field of the invention relates generally to nano-fabrication of structures, and more particularly to generating a fluid drop pattern for imprint lithography.

BACKGROUND

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is referred to as imprint lithography. Exemplary imprint lithography processes are described in detail in numerous publications, such as U.S. Pat. No. 6,980,259; U.S. Patent Application Publication No. 2004/0065252; and U.S. Pat. No. 6,936,194, entitled "Functional Patterning Material for Imprint Lithography Processes," all of which are hereby incorporated by reference herein.

An imprint lithography technique disclosed in each of the aforementioned United States patent application publication and United States patents includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

SUMMARY

In one aspect, generating a fluid drop pattern for an imprint lithography process includes selecting an imprinting surface and generating a fluid drop pattern including drop locations for placement of a multiplicity of drops of substantially equal volume on an imprint lithography substrate. The fluid drop pattern is generated through one or more modified Lloyd's method iterations. The fluid drop pattern allows substantially complete filling of imprinting surface features and formation of a substantially uniform residual layer during the imprint lithography process.

In another aspect, forming a patterned layer on a substrate in imprint lithography includes selecting an imprinting surface, and generating a fluid map to represent a distribution of fluid volume effective to allow successful replication of the imprinting surface. A modified Lloyd's method is used to generate a fluid drop pattern from the fluid map. The fluid drop pattern includes drop locations for drops of substantially equal volume. Fluid is applied to the substrate according to the fluid drop pattern, and the fluid drops are contacted with a template to spread the fluid on the substrate. The fluid is solidified on the substrate to form a patterned layer on the substrate. The patterned layer is a successful replication of the imprinting surface.

DETAILED DESCRIPTION

Figure 1:
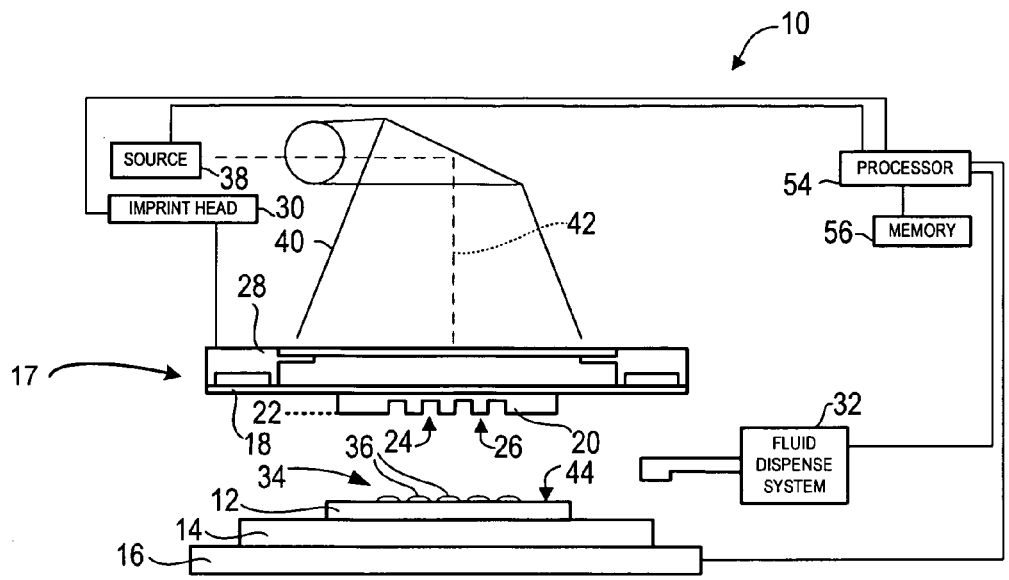
FIG. 1 is a simplified side view of a lithographic system having a mold spaced-apart from a substrate.

Referring to FIG. 1, a system 10 for forming a relief pattern on a substrate 12 is shown. Substrate 12 may be coupled to a substrate chuck 14. As shown substrate chuck 14 is a vacuum chuck, however, substrate chuck 14 may be any chuck including, but not limited to, vacuum, pin-type, groove-type, or electromagnetic, as described in U.S. Pat. No. 6,873,087, which is hereby incorporated by reference herein. Substrate 12 and substrate chuck 14 may be supported upon a stage 16. Further, stage 16, substrate 12, and substrate chuck 14 may be positioned on a base (not shown). Stage 16 may provide motion about the x and y axes.

Spaced-apart from substrate 12 is a patterning device 17. Patterning device 17 includes a template 18 having a mesa 20 extending therefrom towards substrate 12 with a patterning surface 22 thereon. Further, mesa 20 may be referred to as a mold 20. Mesa 20 may also be referred to as a nanoimprint mold 20. In a further embodiment, template 18 may be substantially absent of mold 20. Template 18 and/or mold 20 may be formed from such materials including, but not limited to, fused-silica, quartz, silicon, organic polymers, siloxane polymers, borosilicate glass, fluorocarbon polymers, metal, and hardened sapphire. As shown, patterning surface 22 includes features defined by a plurality of spaced-apart recesses 24 and protrusions 26. However, in a further embodiment, patterning surface 22 may be substantially smooth and/or planar. Patterning surface 22 may define an original pattern that forms the basis of a pattern to be formed on substrate 12. Template 18 may be coupled to a template chuck 28, template chuck 28 being any chuck including, but not limited to, vacuum, pin-type, groove-type, or electromagnetic, as described in U.S. Pat. No. 6,873,087. Further, template chuck 28 may be coupled to an imprint head 30 to facilitate movement of template 18, and therefore, mold 20.

System 10 further includes a fluid dispense system 32. Fluid dispense system 32 may be in fluid communication with substrate 12 so as to deposit polymerizable material 34 thereon. System 10 may include any number of fluid dispensers, and fluid dispense system 32 may include a plurality of dispensing units therein. Polymerizable material 34 may be positioned upon substrate 12 using any drop dispense technique. Polymerizable material 34 may be disposed upon substrate 12 before the desired volume is defined between mold 20 and substrate 12. However, polymerizable material 34 may fill the volume after the desired volume has been obtained.

Figure 2:
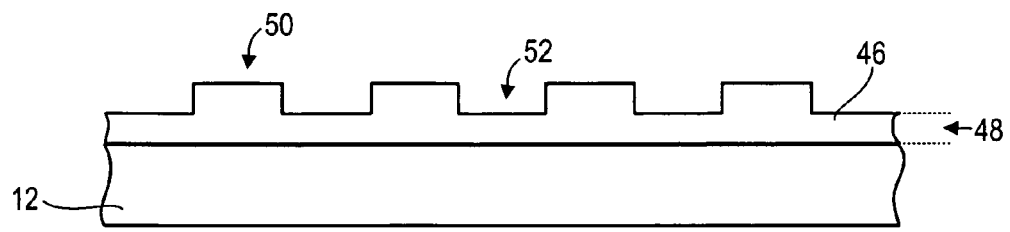
FIG. 2 is a side view of the substrate shown in FIG. 1, having a patterned layer thereon.

Referring to FIGS. 1 and 2, system 10 further includes a source 38 of energy 40 coupled to direct energy 40 along a path 42. Imprint head 30 and stage 16 are configured to arrange mold 20 and substrate 12, respectively, to be in superimposition and disposed in path 42. Either imprint head 30, stage 16, or both vary a distance between mold 20 and substrate 12 to define a desired volume therebetween that is filled by polymerizable material 34. After the desired volume is filled with polymerizable material 34, source 38 produces energy 40, e.g., broadband ultraviolet radiation that causes polymerizable material 34 to solidify and/or cross-link, conforming to the shape of a surface 44 of substrate 12 and patterning surface 22, defining a patterned layer 46 on substrate 12. Patterned layer 46 may include a residual layer 48 and a plurality of features shown as protrusions 50 and recessions 52. System 10 may be regulated by a processor 54 that is in data communication with stage 16, imprint head 30, fluid dispense system 32, and source 38, operating on a computer readable program stored in memory 56.

The above-mentioned may be further employed in imprint lithography processes and systems referred to in U.S. Pat. Nos. 6,932,934; 7,077,992; 7,179,396; and 7,396,475, all of which are hereby incorporated by reference herein. In a further embodiment, the above-mentioned may be employed in any known technique, e.g., photolithography (various wavelengths including G line, I line, 248 nm, 193 nm, 157 nm, and 13.2-13.4 nm), contact lithography, e-beam lithography, x-ray lithography, ion-beam lithography and atomic beam lithography.

Current imprint lithography systems and methods, as described in United States Patent Application Publication No. 2005/0270312, filed as U.S. patent application Ser. No. 11/143,092 entitled "Fluid Dispensing and Drop-On-Demand Dispensing for Nano-Scale Manufacturing" and United States Patent Application Publication No. 2005/0106321, filed as U.S. patent application Ser. No. 10/714,088 entitled "Dispense Geometry to Achieve High-Speed Filling and Throughput", both of which are incorporated by reference herein, use Drop-on-Demand technology to place drops of polymerizable material on a substrate before imprinting. The fluid dispenser dispenses fluid in discrete volumes and at discrete locations. This method is useful for any imprint system using Drop-on-Demand application with these constraints.

U.S. Patent Application Publication No. 2007/0141271, which is hereby incorporated by reference herein, describes a method of controlling the distribution of fluid on a body. The method includes generating a sequence of patterns of liquid upon a substrate, each sequence including a plurality of spaced-apart liquid regions, with voids defined between adjacent liquid regions. A second of the patterns of liquid of the sequence is arranged so that the liquid regions associated therewith are in superimposition with the voids of a first of the patterns of liquid of the sequence.

As described herein, a fluid drop pattern can be generated for use with an imprinting (e.g., patterning) surface in an imprint lithography process. When polymerizable material is applied to the substrate according to the drop pattern, the polymerizable material substantially completely fills features of the imprinting surface during the imprinting process. After polymerization, the imprinting surface is successfully replicated in the patterned layer (e.g., the size and shape of the protrusions in the patterned layer substantially match the size and shape of the corresponding recesses in the imprinting surface, if present) and the residual layer is of a desired, substantially uniform thickness.

As used herein, "drop location" is an x,y coordinate in $\underline{R}^2$. The set of available locations G is determined by the dispense hardware and the dispensing strategy. The dispensing strategy encompasses the number of physical dispensers, or heads, in the system and the number of stage passes allowed.

A fluid map M is a two dimensional grid of voxels or volumetric pixels. Each element of the grid represents the exact fluid volume requirement for that grid location. Each dispenser has an ideal volume $v_{ideal}$, however the effective dispensed volume may be different. The variations are due to assembly and machining variations in the dispenser itself and evaporation of the fluid after it has been dispensed. The amount of evaporation, or volume loss, is related to the chemical composition of the fluid, localized air velocities, and the spatial distribution of the fluid on the wafer. These aspects can be modeled and corrected for by applying a volume transformation function f to the fluid map. In some cases, this function is an identity transform. In a simple transform, f applies a scalar correction to requested volume.

Given a fluid map M, a drop volume function $f$, and a set of possible drop locations G, a goal is to identify the subset P, where $P \subset G$, which should be used to place the drops to match the spatial volume distribution specified in M. More formally, P is a solution to the following optimization problem.

$$\text{minimize} \sum_{i=1}^{n} \|p_i - z_i\|_2^2 \quad (1)$$

$$\text{subject to} \sum_{k \in \Omega_i} f(M_k) = v_{ideal} \quad (2)$$

$$p_i \subset G \quad (3)$$

where The convex set of voxels allocated to drop i is $\Omega_i$

The (x, y) location of voxel k is $x_k$

The volume weighted centroid of drop i is $$z_i = \frac{\sum_{k \in \Omega_i} f(M_k) x_k}{\sum_{k \in \Omega_i} f(M_k)}$$

As shown in (2), this problem, which is commonly known as a least-squares assignment problem, can be solved by finding the optimal power diagram. Solving this problem can include the following steps:

1. Determine the number of drops n needed to satisfy M where $$n = \frac{1}{v_{ideal}} \sum_i^R \sum_j^C f(M, i, j)$$

2. Select a starting subset $P_0$ of G such that $n=\|P_0\|_0$
3. Set l=0 then repeat until converged
   1. Compute power diagram of $P_l$ given map M
   2. Set $P'_{l+1}$ to the volume weighted centroid of each region
   3. Set $P'_{l+1}$ to the snapped $P'_{l+1}$ locations of G
   4. Increment l.

Steps 3.1 and 3.2 solve a relaxed version of the optimization problem by analyzing the problem in the continuous domain. Step 3.3 discretizes the continuous solution P' and generates a physically realizable solution P by enforcing the $2^{nd}$ constraint, (3).

The progression of the solution can be monitored by tracking the value of the objective function and by tracking the distribution of volumes. The criteria for convergence may be based on elapsed time, the value of the objective function, the value of the constraints exceeding a threshold, etc. The final solution P is considered to be optimal for residual layer thickness uniformity because the volume requirements described in M are met exactly.

The procedure to build a power diagram (2) is nearly identical to the procedure to build a Voronoi diagram. The difference is that each generator location has an associated weight $\lambda_i$. At the start of the procedure the weights are initialized to 0.0 and are then updated according to (4).

$$\lambda_{l+1,i} = \lambda_{l,i} + \alpha \left( \frac{\sum_{k \in \Omega_{l,i}} f(M_k)}{v_{ideal}} - 1 \right) \quad (4)$$

The scaling factor of $\alpha$ is used to give the weights a value which is similar to the typical inter-drop distance.

When building a Voronoi diagram the voxels in M are partitioned into the regions $\Omega_i$ based on (5) where the voxel is assigned to the closest generator in P, $$\|p_i - x_k\|_2 \quad (5)$$

but with the power diagram the voxels are assigned to closest weighted generator, (6).

$$\|p_i - x_k\|_2 + \lambda_i \quad (6)$$

Figure 3:
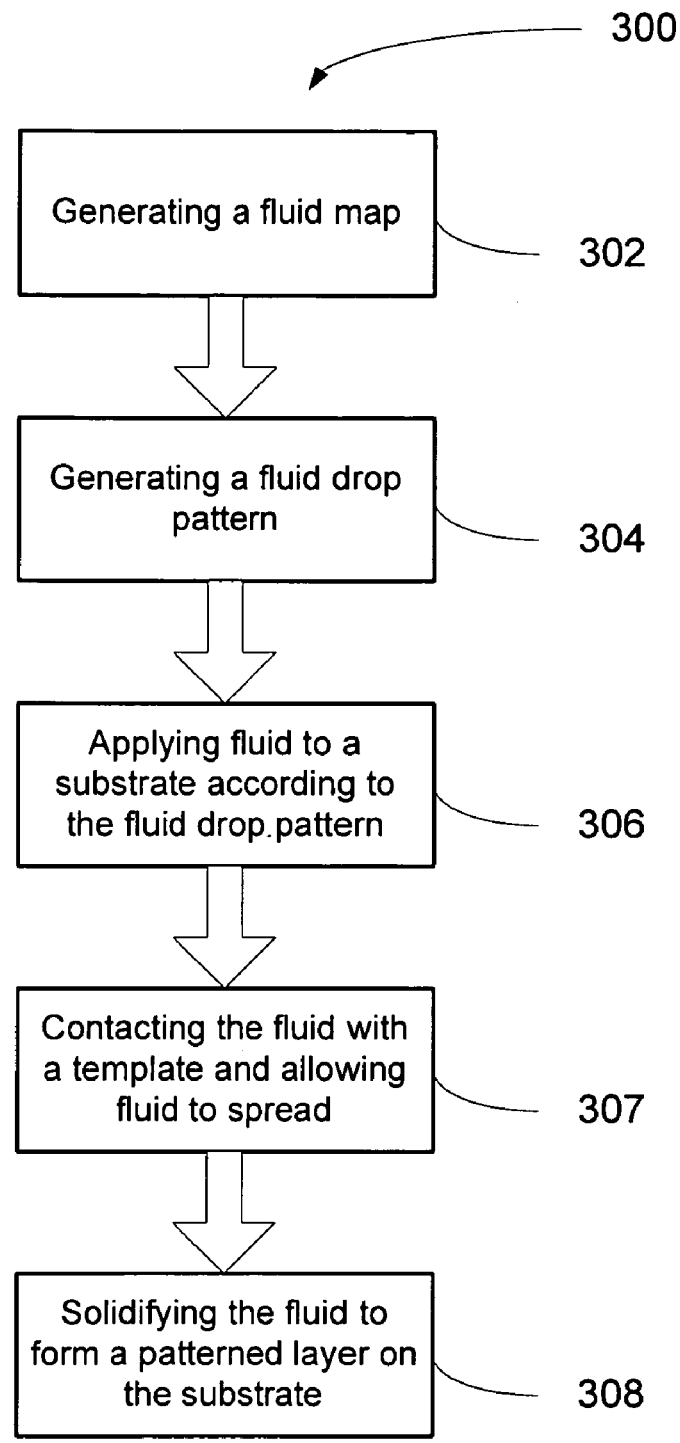
FIG. 3 a flow chart showing a process for replicating an imprinting surface in an imprint lithography process.

FIG. 3 is a flow chart showing a process for replicating an imprinting surface in an imprint lithography process. Process 300 includes generating a fluid map 302, generating a fluid drop pattern 304, applying fluid to a substrate according to the fluid drop pattern 306, contacting the fluid with a template to spread the fluid 308, and solidifying the fluid to form a patterned layer on the substrate 308. The fluid can be, for example, a polymerizable material. Generating the fluid drop pattern includes starting with an initial set of drop locations, factoring in considerations described above (e.g., drop dispenser locations), and adjusting theoretical drop locations to be compatible with this and other equipment constraints and to minimize template effects such as surfactant buildup.

Figure 4:
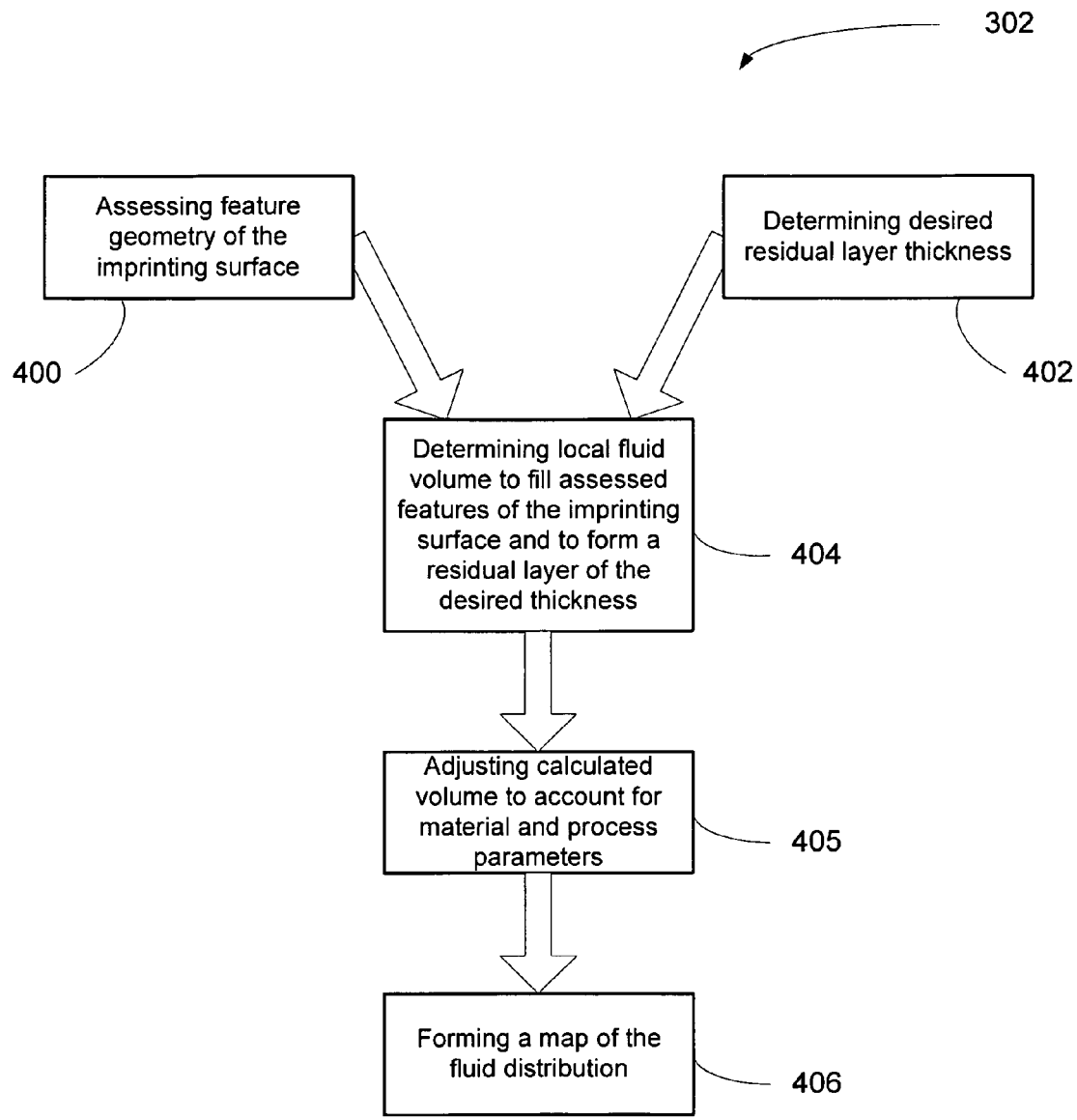
FIG. 4 is a flow chart that depicts generating a fluid map.

FIG. 4 is a flow chart that depicts generating the fluid map 302. Generating the fluid map 302 includes assessing the feature geometry of the imprinting surface 400 and determining the desired residual layer thickness 402. Step 404 includes determining the local fluid volume needed to fill the assessed features of the imprinting surface and to form a residual layer of the desired thickness. Step 405 includes assessing properties of the fluid (e.g., shrinkage of polymerizable material), the substrate (e.g., surface energy), the fluid applicator (e.g., calibration parameters, drop volumes, drop placement, etc.), other process parameters, and any combination thereof, and incorporating this information into the formation of a fluid distribution map. Step 406 includes forming a map of the fluid distribution (e.g., a fluid map representing local fluid volume needed) that will allow successful replication of the imprinting surface in an imprint lithography process. Properties of the fluid (e.g., evaporation, shrinkage of polymerizable material), the substrate (e.g., surface energy), and the fluid applicator (e.g., calibration parameters, drop volumes, dispenser locations, etc.), may be used in generating the fluid map.

Figure 5:
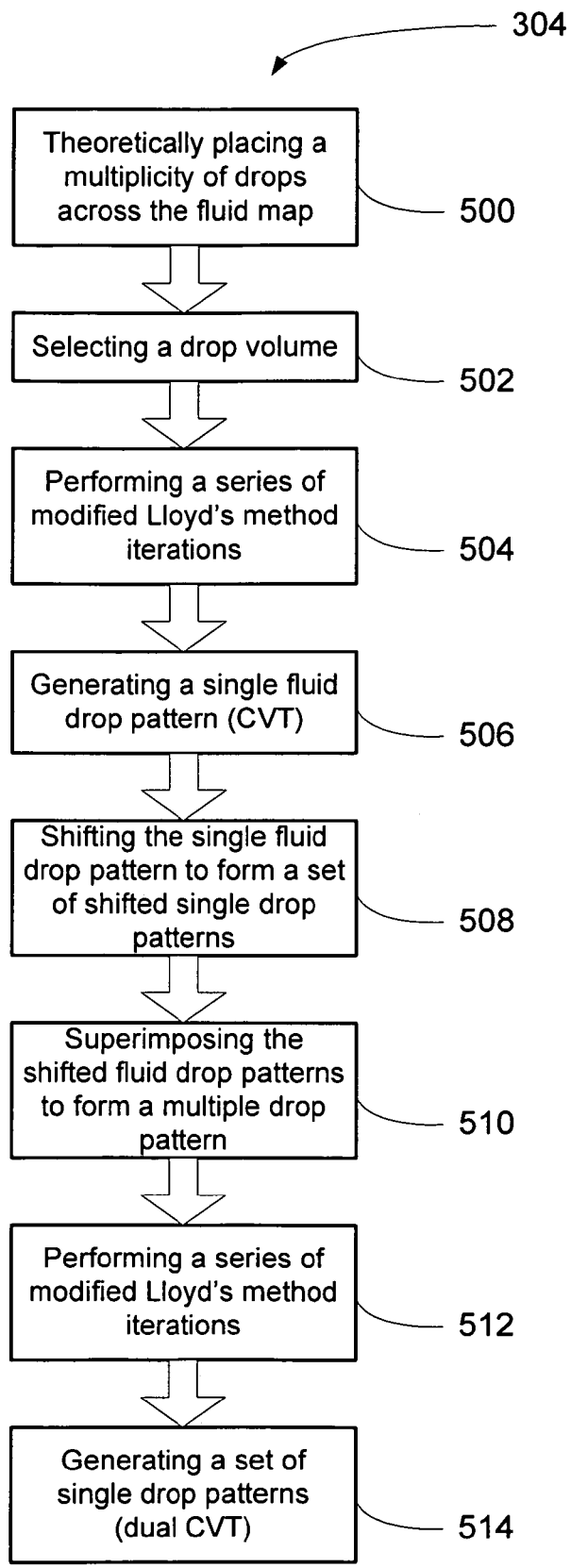
FIG. 5 is a flow chart that depicts generating a fluid drop pattern from a fluid map.

FIG. 5 is a flow chart that depicts generating a fluid drop pattern 304 from a fluid map for a selected imprint area. As described above, generating a fluid drop pattern 304 includes theoretically placing a multiplicity of drops across the fluid map 500. In some cases, no two drop locations map to the same fluid map cell. A fixed drop volume is selected 502. The fixed drop volume may be determined by the drop applicator. The fixed drop volume and number of drops are selected such that the sum of drop volumes of the multiplicity of drops is substantially equal to the sum of the cell volumes in the fluid map. In some cases, generating a fluid drop pattern is expedited by selecting an initial drop pattern that at least roughly corresponds to the fluid distribution in the fluid map.

When the fluid map represents a substantially uniform volume distribution (e.g., the imprinting surface is substantially "unpatterned," or without intentional protrusions and recesses), the fluid volume associated with each fluid map cell can be substantially the same. When the fluid map represents a non-uniform volume distribution (e.g., the imprinting surface is "patterned," or with intentional protrusions and recesses), however, fluid volume associated with a fluid map cell can vary based upon the features of the imprinting surface associated with the cell. In this case, the volume of the theoretical drop chosen to fill the fluid map cell can vary based upon the features of the imprinting surface associated with the cell and the size of the cell.

To allow for a substantially uniform drop volume in the fluid drop pattern, as required by some fluid applicators, while achieving the desired non-uniform volume distribution in the imprinting area, a series of modified Lloyd's method iterations may be performed 504. Lloyd's method is described in "Random Marks on Paper, Non-Photorealistic Rendering with Small Primitives," Adrian Secord, Master's Thesis, The University of British Columbia, October 2002, which is incorporated by reference herein. This method includes computing the Voronoi diagram of the generating points in the imprinting area, computing the centroid of each Voronoi region in the diagram, and moving each generating point to its centroid.

The modified Lloyd's method iterations used herein involve computing the Voronoi tessellation of the drop pattern (that is, breaking it into regions that are closer to that drop than any other). Then, instead of moving the drop to the center of mass of its Voronoi region as with Lloyd's method, the drop is moved to a location that coincides with a weighted mean of all of the Voronoi region centers of mass. Each center of mass is weighted based on its volume deficit and the distance between the centers of mass of the Voronoi regions of the two drops. This modification to Lloyd's method allows the drop locations to converge to a result in which drop densities approximate the fluid density in the underlying fluid map. Without this modification to Lloyd's method, drops converge to a solution that is well-spaced, but that does not necessarily fit the underlying fluid density changes.

The modified Lloyd's method iterations transform the drop distribution based on fluid map cells to a distribution based on an approximate centroidal Voronoi tessellation in which the volume of the modified fluid map cells (now Voronoi regions) associated with a drop location is close to a fixed volume. Iterations are continued until a user intervenes, a convergence criterion is met, or a pre-determined length of time has elapsed. A fluid drop pattern is generated 506 following convergence of the modified Lloyd's method.

If the starting set $P_0$ is generated deterministically then there will be single unique solution. However if the starting point $P_0$ is determined randomly then the solutions will be similar but different. In this way the inability of the procedure to find the global optimum can be exploited to generate a set of drop patterns with similar qualities that use different subsets of G.

The single drop pattern generated in the centroidal Voronoi tessellation (CVT) process in steps 504 and 506 can be used to form additional drop patterns, each of which can be used independently (e.g., in a random or selected order during successive fabrication steps) to provide desired coverage of an imprinting surface. For example, a single drop pattern can be duplicated and translated a distance a first direction to form a shifted drop pattern 508. Multiple shifted drop patterns can be formed by duplicating and translating the single drop pattern in one or more additional directions (e.g., a second, third, or fourth direction). The shifted drop patterns can then be superimposed to form a multiple drop pattern 510, retaining the association of each drop with the drop pattern from which it originated.

The superimposed drop pattern formed in step 510 is then run through a second round of modified Lloyd's method iterations 512 in a dual CVT process, causing the shifted drop locations to spread to a uniform distance, approximating the initial fluid map. A multiple fluid drop pattern is generated 514 following the second iteration and convergence of the modified Lloyd's method. The multiple fluid drop pattern can then be deconstructed such that each drop location is associated with the shifted pattern from which it originated. This process yields, for example, four adjusted shifted patterns that can be implemented successively or in any desired order. To reduce effects such as non-uniformity and surfactant buildup during successive imprints, the shifted patterns can be combined with (e.g., alternated with) individual iterations on each drop pattern, and appropriate weighting factors can be applied to each type of iteration. Use of a set of adjusted single drop patterns can also promote more complete expelling of gases from interstitial regions between drops during repeated imprinting.

When a multiple drop pattern is not advantageous, a single drop pattern can be used, and the formation of shifted drop patterns is not necessary. Whether one drop pattern or multiple drop patterns are used, after iterations are complete, fluid is applied to a substrate 306 according to the selected fluid drop pattern, with each drop matched to an available (e.g., the nearest available) fluid dispenser location. The fluid, deposited according to the fluid drop pattern, is then contacted with an imprinting surface and polymerized 308 to form a polymerized layer on a substrate.

Figure 6A:
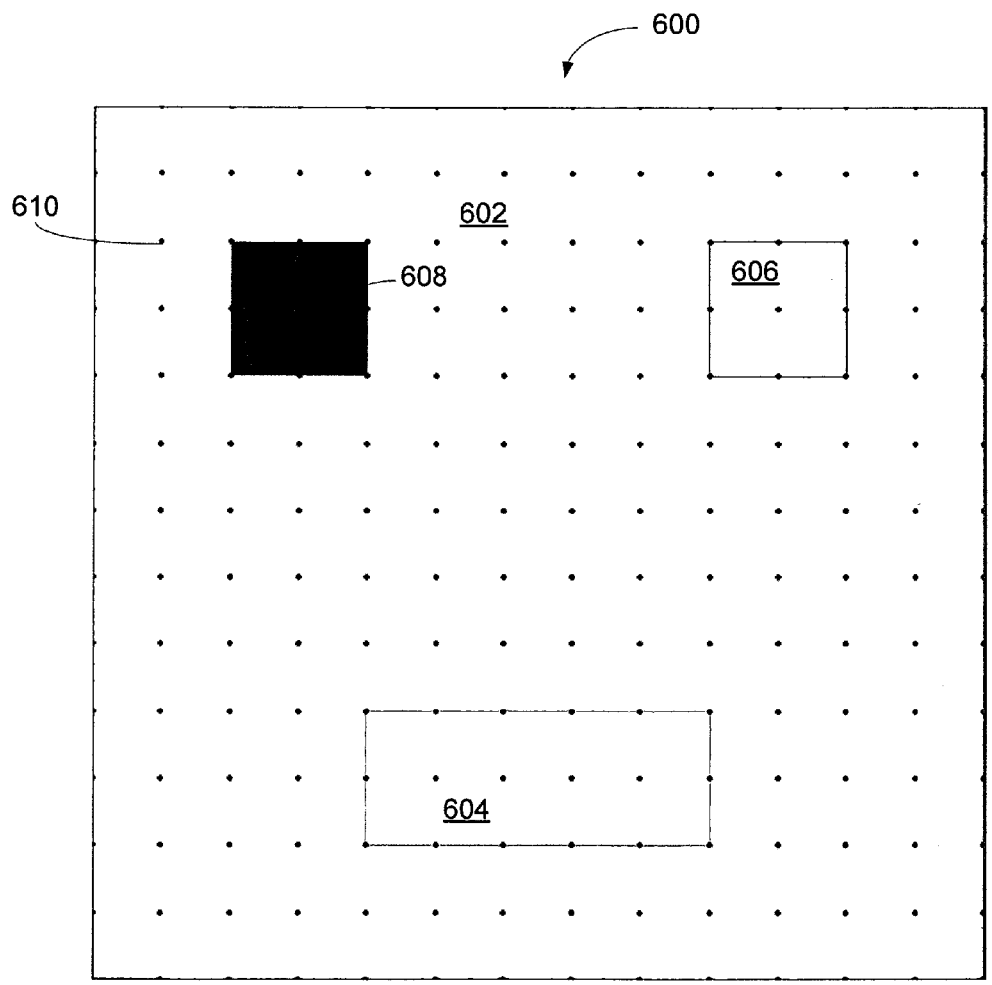
FIG. 6A shows a fluid map and initial drop locations for a patterned surface.
Figure 6B:
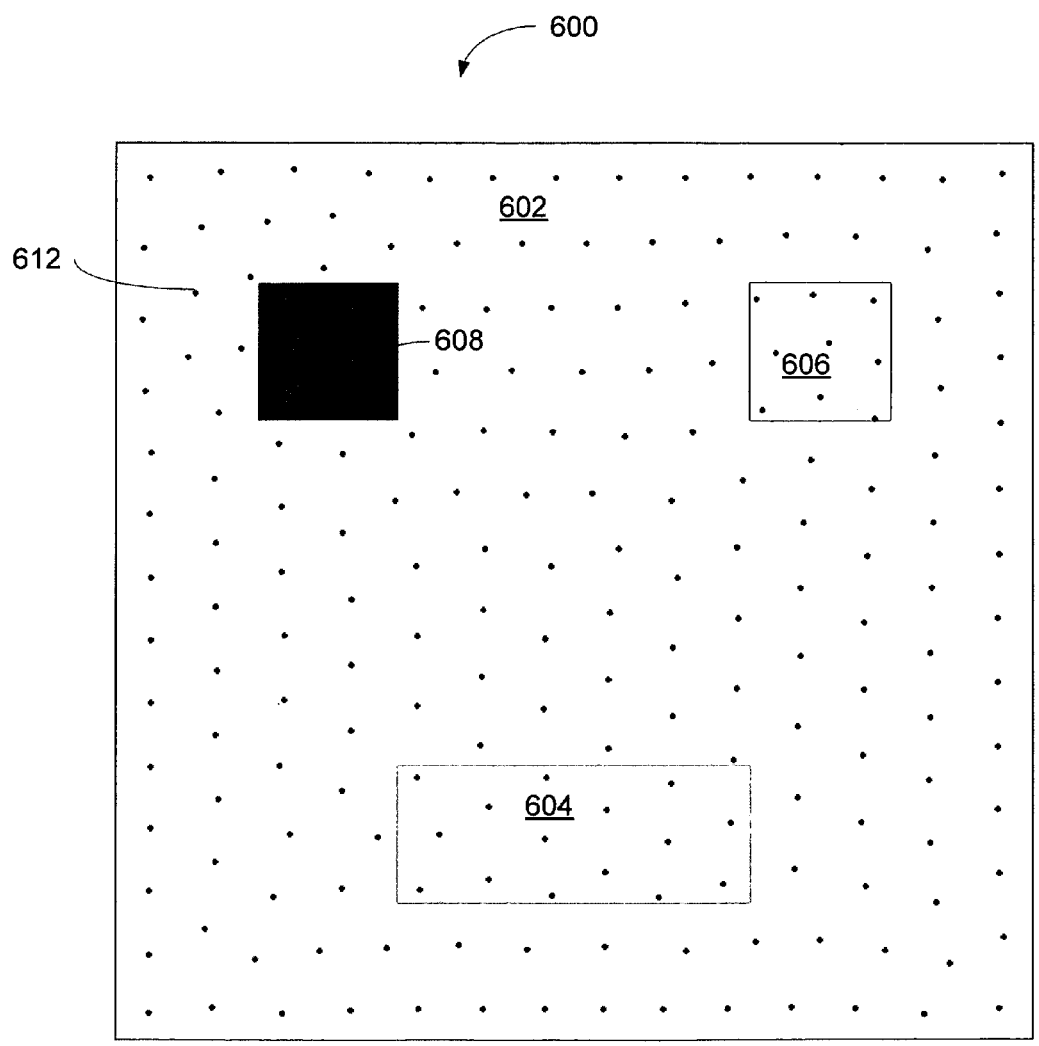
FIG. 6B shows optimized drop locations for the patterned surface in FIG. 6A.

FIG. 6A shows a fluid map 600 with region 602 having a substantially uniform depth, region 604 recessed with respect to region 602, region 606 more deeply recessed with respect to region 602, and region 608 protruding with respect to region 602. Initial drop locations 610 are evenly spaced. Application of the modified Lloyd's method yields optimized drop locations 612 shown in FIG. 6B, with an increased drop density in regions 604 and 606 and a reduced drop density in region 608 compared to the drop density in region 602.

Figure 6C:
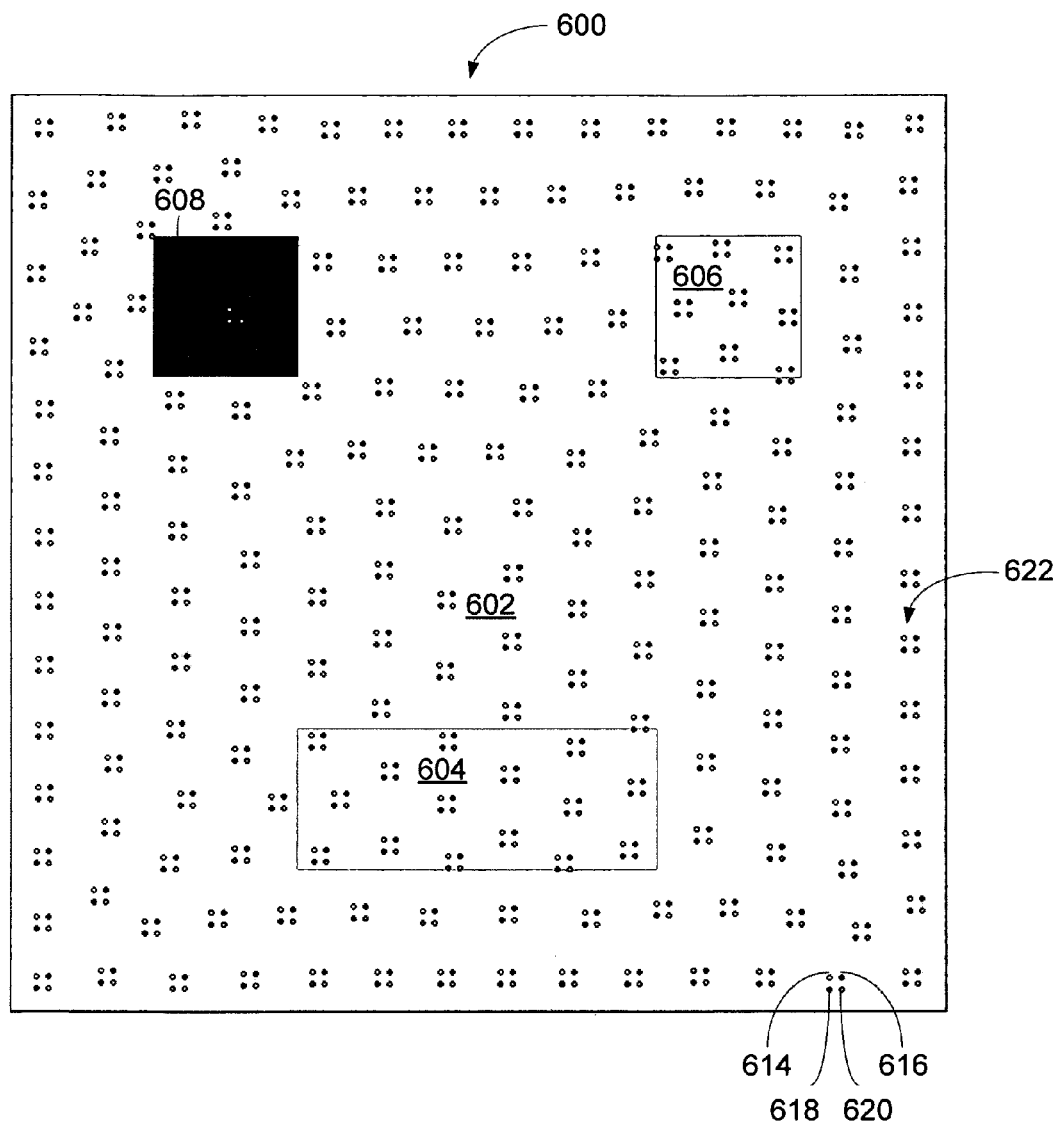
FIG. 6C shows shifted single drop patterns created from the single drop pattern in FIG. 6B and superimposed to form a multiple drop pattern.
Figure 6D:
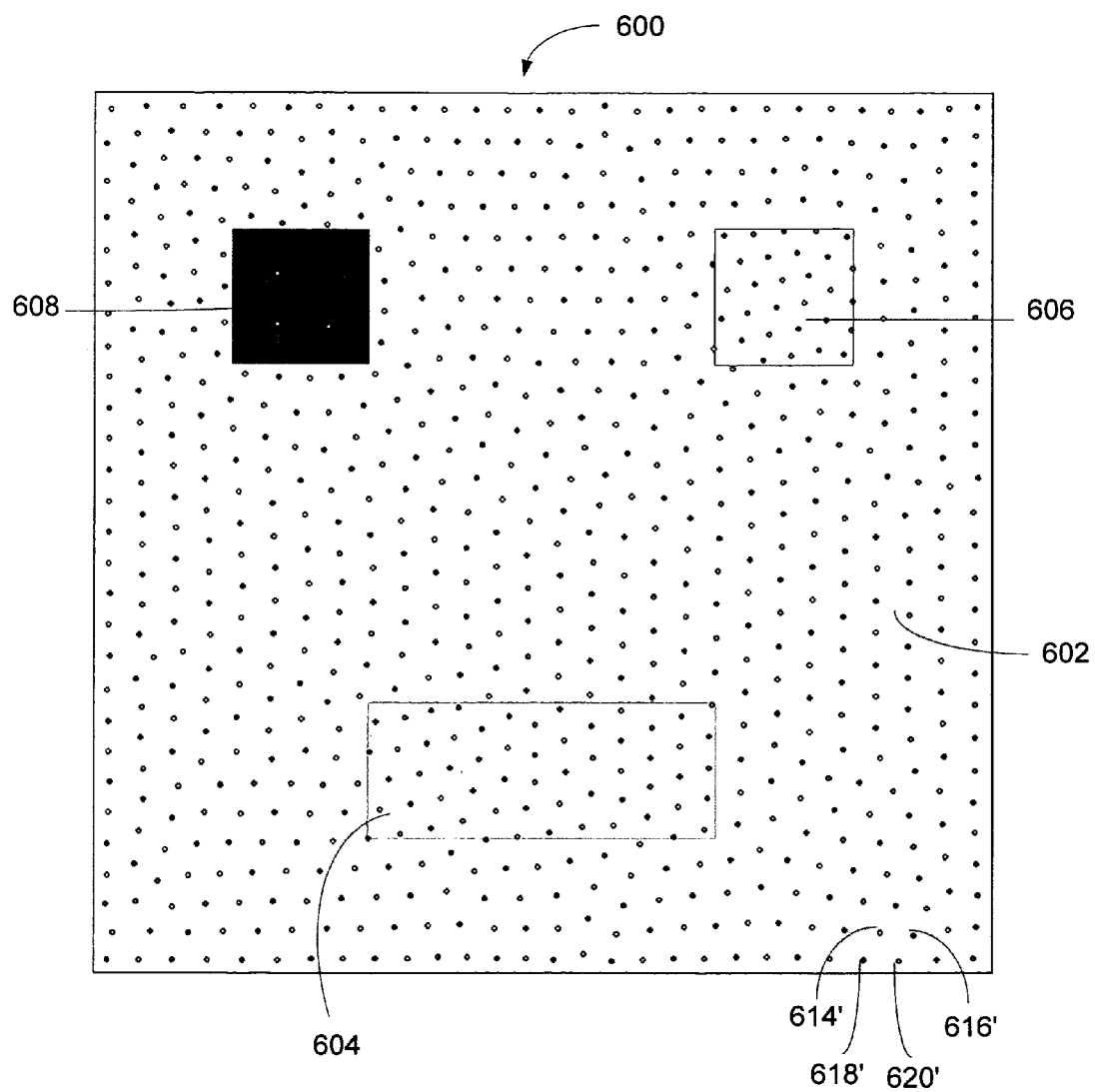
FIG. 6D shows the multiple drop pattern in FIG. 7C after undergoing an optimization process.

A multiple drop pattern can be formed from any number of superimposed single drop patterns (e.g., four). Referring to FIG. 6C, drops 612 are duplicated and shifted in four different directions to form four single drop patterns represented by drop locations 614, 616, 618, and 620. Multiple drop pattern 622 is formed by superimposing the four single drop patterns. A second consecutive iterative process (dual CVT) is applied to multiple drop pattern 622 to optimize drop locations in the shifted single drop patterns 614, 616, 618, and 620 with respect to each other to form adjusted shifted single drop patterns 614', 616', 618', and 620', respectively, shown in FIG. 6D. This optimization can be used to adjust relative positioning of the drop locations in the shifted single drop patterns to reduce undesirable template effects such as surfactant buildup from successive imprinting with overlapping drop locations. Optimization may also include a step to "snap" a calculated drop location to a fluid dispenser location.

The adjusted single drop patterns 614', 616', 618', and 620' may be used individually in any selected or random order, along with any desired variations of the adjusted single drop patterns, to apply fluid to a substrate for successive imprinting during fabrication. For example, a first subset (e.g., one-fourth) of the drops depicted in FIG. 6D may be applied to a substrate during fabrication. In subsequent processes, a second subset of the drops depicted in FIG. 6D may be applied to another substrate during fabrication, and so forth, such that different dispenser locations are used in a random or rotating sequence of the four adjusted single drop patterns.

The efficacy of a drop pattern can be quantified by the distribution of fluid volumes in Voronoi regions. Convergence criteria can take the form of maximum Voronoi region volume or standard deviation of Voronoi region volumes. This can also be used to quantify error induced by producing shifted drop patterns and by matching (or "snapping") theoretical drop locations in a drop pattern to fluid dispenser or applicator locations.

Figure 7:
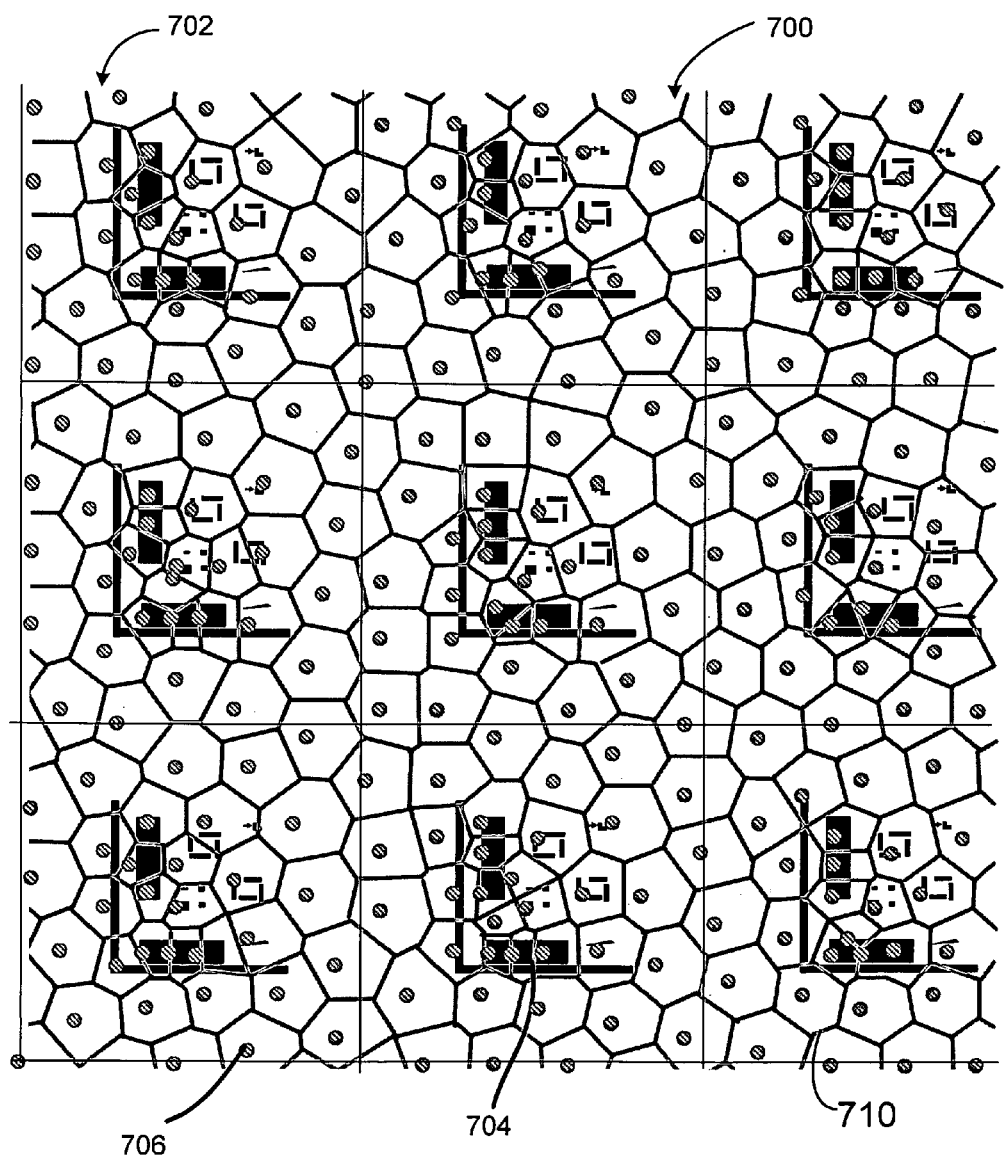
FIG. 7 shows a single drop pattern for a complex patterned region generated by a CVT process.

FIG. 7 shows fluid map 700, with single drop pattern 702 generated by a CVT process. Fluid map 700 includes nine substantially similar cells, with shaded regions indicating features 704 in the imprinting surface. Other regions of the fluid map correspond to substantially unpatterned regions of the imprinting surface, and require an effective amount of fluid to form the desired residual layer. Drop locations 706 are shown in Voronoi regions 708. As indicated in FIG. 7, drop density is higher proximate features 704 of the fluid map 700 (i.e., proximate regions with features in the imprinting surface).

As seen in FIG. 7, Voronoi regions 708 are not always centered on features 704 of the fluid map 702. In particular, drops that are primarily allocated to features 704 may not line up along Cartesian directions of the features. In some cases, features in a fluid map may be identified and drop patterns generated such that drop locations are substantially aligned with the features, allowing more rapid filling of features for higher throughput in the imprint lithography process.

Figure 8:
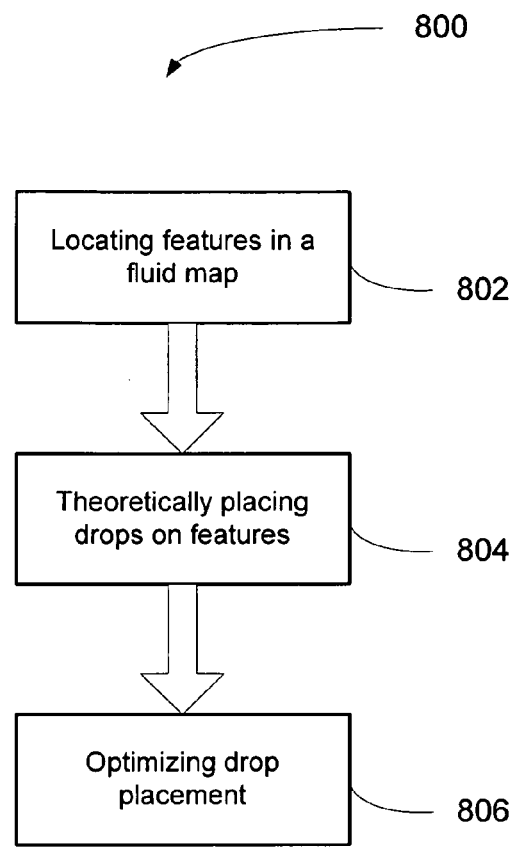
FIG. 8 is a flow chart showing a process for placing fluid drops on features of interest in a complex patterned region.

Drop patterns with drop locations substantially aligned with the features may be calculated by methods including power centroidal Voronoi tessellation (PCVT) 800 outlined in the flow chart in FIG. 8. Method 800 includes locating features in a fluid map 802, theoretically placing drops on features 804, and optimizing drop placement 806. Steps 802-806 can be achieved as described below.

1. Generate a list $L_{all}$ of all discrete features in M
2. Apply a first rule set $r_I$ to target a subset of import features $$L_I = r_I(L_{all})$$

3. Apply a second rule set $r_{nc}$ to identify non-convex features $$L_{nc} = r_{nc}(L_I)$$

such that $$L_I = L_c \cup I_{nc}$$

4. For each non-convex feature in $L_{nc}$
   1. Try to split the feature into convex sub-features $$L_{sub} = ncut(L_{nc_i})$$

2. Apply $r_I$ to $L_s$ to find $L_{sub_I}$ $$L_{sub_I} = r_I(L_{sub})$$

3. Apply $r_{nc}$ again to identify non-convex features. Repeat steps 1 and 2 until all features are convex
   4. Append the new set of convex sub features to set of all convex features $$L_c = L_c \cup L_{sub_I}$$

4. Set F'={ } then for each feature in $L_c$
   1. Apply a third rule set $r_s$ to split the feature into a regular grid of sub-features
   2. Place at drop d on the centroid of each sub-feature
   3. Append the drop location to the set of feature drops $$F' = F' \cup d$$

5. Set F to the snapped drop locations F' of G
6. Calculate the number of additional drops m needed to satisfy the volume requirements of M $$m = \frac{1}{V_{ideal}} \sum_i^R \sum_j^C f(M, i, j) - \|F\|_0$$

7. Select a starting subset $R_0$ of G such that $m = \|R_0\|_0$
8. $P_0 = F \cup R_0$
9. Set l=0 then repeat until converged
   1. Compute the power diagram of the given map M with generators $P_l$
   2. Set $R'_{l+1}$, to the volume weighted centroid of each region for the drops in $R_0$
   3. Set $R_{l+1}$ to the snapped $R'_{l+1}$ locations of G
   4. $P_{l+1} = F \cup R_{l+1}$
   5. Increment l.

In step 802, "features" can be thought of as regions of local similarity. Therefore finding features in the fluid map can be framed as an unsupervised clustering problem. There are numerous clustering algorithms such as spectral clustering, k-means clustering, etc., as well as the following procedure, which can be applied.

Inputs:
A pixel neighborhood function $\Omega$.
  Default is North, South, East, West
A fluid map M with n=r×c voxels
A volume change threshold $\sigma$ Output:
A k×n matrix with n non-zero values where the sum of each column is 1. The voxels assigned to the $k^{th}$ feature have 1's on the $k^{th}$ row.

Procedure:
1. Build an affinity matrix A from M
A is n×n in size
where $$A_{i,j} = \begin{cases} e^{\left(\frac{-|M_i - M_j|^2}{\sigma^2}\right)} & j \in \Omega_i \\ 0 & \text{otherwise} \end{cases}$$

2. Perform a depth first traversal of A for each i, j. If $A_{i,j} \geq 0.5$ then $A_{i,j}$ is assigned to the $k^{th}$ cluster. Once an $A_{i,j}$ has been assigned it can not be re-assigned. Increment k after each traversal terminates.

To reduce the memory requirements, the affinity matrix can be built on the fly during the depth first traversal and the output assignment matrix can be stored in a sparse matrix data structure.

Extensions to the basic procedure are possible. The clustering behavior can be modified, for example, by changing the affinity function and changing the neighborhood function. In some cases, it is useful to relax the neighborhood function to allow for voxel skipping. This provides a degree of localized clustering for those cases where there are several small disconnected features which form a larger meta feature.

The affinity function can be changed so that a function g can be applied to the fluid map.

$$A_{i,j} = e^{\left(\frac{-|g(M_i) - g(M_j)|^2}{\sigma^2}\right)} \quad (7)$$

One currently available g function averages over a region around the voxel of interest. Another implemented function applies a volume threshold thereby converting the fluid map into a binary image.

In placing the drops on features 804, statistics such as total voxel area, bounding box area, total volume, aspect ratio, etc. can be calculated for each feature. Rules can refer to these statistics of the feature. The user can then exclude or identify different features by writing a set of rules which are processed against each feature.

As described above the first rule set $r_I$ is used to identify features, or conversely to discard unwanted features. Features that are likely to be discarded are those that are too small, and can be safely ignored, or those that are too large and are best handled by the standard optimization routine.

The second rule set $r_{nc}$ encodes a heuristic to determine non-convex features. This is typically done by comparing the number of voxels with volume to the total number of voxels in the bounding area of the feature. If a feature is deemed non-concave then it is recursively segmented using a normalized cut version of spectral clustering until all segments or sub-features are concave. Spectral clustering is described by Ng et al., "On Spectral Clustering: Analysis and Algorithm," Advances in Neural Information Processing Systems 14: 2001 Proceedings and von Luxburg, in "A tutorial on Spectral Clustering," Statistics and Computing, 17(4) 2007, both of which are incorporated herein by reference in their entirety. refer to [4].

The next step includes applying the third rule set $r_s$ to the remaining features to determine the segmentation grid for the feature. The rules can be used to determine the grid that should be mapped onto the feature. A single drop is allocated to each grid location and is initially placed on the volume weighted centroid for that segment. This location is then snapped to a valid location in G and then added to the set of feature drops F.

In step 806, the generation of the power diagram may remain unchanged. However, due to the presence of the feature drops F which cannot move, the nature of the optimization routine is now changed. A minimum energy configuration of the drops is no longer possible and as such two modifications need to be made to the basic procedure described earlier.

The first change is to impose upper and lower limits, (8), on the weight updates in (4).

$$\lambda_{min} \le \lambda_{I,i} \le \lambda_{max} \qquad (8)$$

The lower limit is particularly important as it inhibits the maximum diameter of a Voronoi region from exceeding a reasonable limit. Without this limit some regions may become elliptically shaped hulls with the generator centroid at an extrema.

The second modification is related to convergence and selection of the optimal pattern. As a function of time, with limits in place on the generator weights, the system will minimize the sum squared error, which results in the distribution of region sizes being minimized. However this minimization will occur at the expense of the range of region sizes, for which there is no explicit constraint. In many cases this is not necessarily the desired solution since fluid filling is typically limited by the slowest to fill region, typically the drop with the largest volume allocation.

In some cases, additional logic can be placed in the iteration routine to keep a copy of the pareto optimal solution that has been encountered. This pattern minimizes the range of region sizes as well as the variation of region sizes. The objective function in (1) is then effectively $$\text{minimize} \sum_{i=1}^{n} \|p_i - z_i\|_2^2 + \max\left(\sum_{k \in \Omega_i} f(M_k)\right) - \min\left(\sum_{k \in \Omega_i} f(M_k)\right). \qquad (9)$$

The presence of strong directionally dominant features on the template can affect the flow of the liquid. As described above, the fluid flow was considered to be symmetric, i.e. to flow radially outward from the generator location in all directions equally, appearing as a growing disc from a top view. In some cases, however. template features inhibit symmetrical flow. For example, long narrow gratings, such as those used in crossbar type memories, can create virtual nanochannels where much more fluid flows in the direction of the grating rather than perpendicularly to them. To incorporate this phenomena into the synthesis flow, the definition of the Voronoi region can be extended to include ellipsoids of arbitrary rotation.

$$\frac{x^2}{w^2} + \frac{y^2}{l^2} = 1 \qquad (10)$$

To realize this, the norm function of equation (5) is modified to include a coordinate system rotation R and an axis weighing W.

$$\|(x_k - p_i)R_i W_i\|_2 \qquad (11)$$

The rotation matrix R is the standard coordinate system where the rotation angle is determined by analyzing the template design (e.g. GDSII file) to determine the primary direction of the features in each Voronoi region. Similarly the weighting matrix $W_i$ for each Voronoi region is generated through analysis of the template design, or by utilizing a physical model, to determine where the fluid will likely flow for each drop or generator location.

This formulation can be extended to the power diagram updates, to enforce the volume constraints, by extending the ellipse to the $3^{rd}$ dimension, i.e. making it a cone, and then assuming evaluation at a fixed z of 1.

$$\frac{x^2}{w^2} + \frac{y^2}{l^2} = \frac{1}{\lambda^2} \qquad (12)$$

Using (12) the matrices used in the norm (11) look like the following, $$R_i W_i = \begin{pmatrix} \cos(\theta_i) & -\sin(\theta_i) \\ \sin(\theta_i) & \cos(\theta_i) \end{pmatrix} \begin{pmatrix} \frac{\lambda_i}{w_i} & 0 \\ 0 & \frac{\lambda_i}{l_i} \end{pmatrix}$$

where $\theta_i$, $w_i$, and $l_i$ are determined from the layout. With these changes the pseudo code to generate the optimal power diagram is the following 1. Determine the number of drops n needed to satisfy M where $$n = \frac{1}{v_{ideal}} \sum_{i}^{R} \sum_{j}^{C} f(M, i, j)$$

2. Select a starting subset $P_0$ of G such that $n = \|P_0\|_0$
3. Set l=0 then repeat until converged
   1. Compute power diagram of $P_l$ given map M
   2. Set $P'_{l+1}$ to the volume weighted centroid of each region
   3. Set $P'_{l+1}$ to the snapped $P'_{l+1}$ locations of G
   4. Estimate $w_i$, $l_i$ and $\theta_i$ for each region
   5. Increment l.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method forming a patterned layer on a substrate in imprint lithography, the method comprising:
   providing a fluid dispense system with a multiplicity of fluid dispensers;
   selecting an imprinting surface having a plurality of pattern features;
   generating a fluid map, wherein the fluid map represents a distribution of fluid volume effective to allow successful replication of the imprinting surface, the fluid map having an array of cells with each cell representing a spatial region of the imprinting surface and having a fluid volume associated therewith;

generating a fluid drop pattern using the fluid map by first generating a theoretical drop pattern with each theoretical drop having a volume chosen to fill the fluid volume of an associated cell of the fluid map and then optimizing the theoretical drop pattern to provide a fluid drop pattern with drop locations for drops of substantially equal volume that are substantially aligned with dispense locations of the fluid dispenser of the fluid dispense system and that allow for successful replication of the imprinting surface; wherein the optimizing further comprises generating an approximate centroidal Voronoi tessellation representation of the theoretical drop pattern comprising Voronoi regions, with each Voronoi region having a center of mass that is weighted based on its volume deficit and distance between centers of mass of adjacent Voronoi regions, and where a theoretical drop location is moved to a location that coincides with a weighted mean of all the Voronoi regions centers of mass;

applying fluid to the substrate with the fluid dispense system according to the generated fluid drop pattern;

contacting the fluid with the imprinting surface;

solidifying the fluid on the substrate to form a patterned layer on the substrate, wherein the patterned layer is a successful replication of the imprinting surface.

2. The method of claim 1, wherein the optimizing further comprises generating an approximate centroidal Voronoi tessellation representation of the drop pattern.

3. The method of claim 2, wherein each Voronoi region comprises one of the fluid drop locations with volume approximately equal to one fluid drop.

4. The method of claim 1, further comprising translating the fluid drop pattern to form a set of shifted fluid drop patterns.

5. The method of claim 4, further comprising superimposing the shifted fluid drop patterns to form a superimposed fluid drop pattern.

6. The method of claim 5, further comprising using an optimization method to form a multiple fluid drop pattern from the superimposed fluid drop pattern.

7. The method of claim 1 wherein the fluid map represents a non-uniform volume distribution.

8. A method of generating a fluid drop pattern for an imprint lithography process, the method comprising:

providing a fluid dispense system with a multiplicity of fluid dispensers;

selecting an imprinting surface having a plurality of pattern features;

generating a fluid map, wherein the fluid map represents a distribution of fluid volume effective to allow successful replication of the imprinting surface, the fluid map having an array of cells with each cell representing a spatial region of the imprinting surface and having a fluid volume associated therewith; and generating a fluid drop pattern using the fluid map by first generating a theoretical drop pattern with each theoretical drop having a volume chosen to fill the fluid volume of an associated cell of the fluid map and then optimizing the theoretical drop pattern to provide a fluid drop pattern with drop locations for drops of substantially equal volume that are substantially aligned with dispense locations of the fluid dispenser of the fluid dispense system and that allow for successful replication of the imprinting surface; wherein the optimizing further comprises generating an approximate centroidal Voronoi tessellation representation of the theoretical drop pattern comprising Voronoi regions, with each Voronoi region having a center of mass that is weighted based on its volume deficit and distance between centers of mass of adjacent Voronoi regions, and where a theoretical drop location is moved to a location that coincides with a weighted mean of all the Voronoi regions centers of mass.

9. The method of claim 8, wherein the optimizing further comprises generating an approximate centroidal Voronoi tessellation representation of the drop pattern.

10. The method of claim 9, wherein each Voronoi region comprises one of the fluid drop locations with volume approximately equal to one fluid drop.

11. The method of claim 8, further comprising translating the fluid drop pattern to form a set of shifted fluid drop patterns.

12. The method of claim 11, further comprising superimposing the shifted fluid drop patterns to form a superimposed fluid drop pattern.

13. The method of claim 12, further comprising using an optimization method to form a multiple fluid drop pattern from the superimposed fluid drop pattern.

14. The method of claim 8 wherein the fluid map represents a non-uniform volume distribution.

* * * * *